United States Patent
Gomez et al.

(10) Patent No.: US 11,145,966 B2
(45) Date of Patent: Oct. 12, 2021

(54) OVER-MOLDED THIN FILM ANTENNA DEVICE

(71) Applicant: PC-TEL, Inc., Bloomingdale, IL (US)

(72) Inventors: Francisco X. Gomez, West Chicago, IL (US); Calin Pod, Crystal Lake, IL (US)

(73) Assignee: PCTEL, Inc., Bloomingdale, IL (US)

( * ) Notice: Subject to any disclaimer, the term of this patent is extended or adjusted under 35 U.S.C. 154(b) by 50 days.

(21) Appl. No.: 16/554,080

(22) Filed: Aug. 28, 2019

(65) Prior Publication Data

US 2021/0066793 A1 Mar. 4, 2021

(51) Int. Cl.
| | |
|---|---|
| *H01Q 1/50* | (2006.01) |
| *B29C 45/14* | (2006.01) |
| *H01P 3/08* | (2006.01) |
| *H03F 3/19* | (2006.01) |
| *H05K 1/18* | (2006.01) |
| *B29L 31/34* | (2006.01) |
| *B29K 105/00* | (2006.01) |

(52) U.S. Cl.
CPC ......... *H01Q 1/50* (2013.01); *B29C 45/14065* (2013.01); *H01P 3/081* (2013.01); *H03F 3/19* (2013.01); *H05K 1/18* (2013.01); *B29K 2105/0097* (2013.01); *B29L 2031/3456* (2013.01); *H03F 2200/294* (2013.01); *H03F 2200/451* (2013.01); *H05K 2201/09027* (2013.01); *H05K 2201/10189* (2013.01)

(58) Field of Classification Search
None
See application file for complete search history.

(56) References Cited

U.S. PATENT DOCUMENTS

| | | | | |
|---|---|---|---|---|
| 5,995,051 A | * | 11/1999 | Sun | H01Q 9/30 343/702 |
| 6,384,799 B1 | * | 5/2002 | Otomo | H01Q 1/242 343/895 |
| 7,554,509 B2 | * | 6/2009 | Hsu | H01Q 1/362 343/895 |
| 2008/0074328 A1 | * | 3/2008 | Noro | H01Q 23/00 343/700 MS |

FOREIGN PATENT DOCUMENTS

| | | |
|---|---|---|
| EP | 1 069 647 A1 | 1/2001 |
| EP | 1 076 378 A2 | 2/2001 |
| EP | 1 076 378 A3 | 2/2002 |
| GB | 2 322 236 A | 8/1998 |

OTHER PUBLICATIONS

Extended European search report form corresponding EP patent application 20188764.3, dated Jan. 11, 2021.

* cited by examiner

*Primary Examiner* — Anh Q Tran
(74) *Attorney, Agent, or Firm* — Husch Blackwell LLP

(57) ABSTRACT

An over-molded thin film antenna device is provided that can include a core mandrel having a body and a lip, a thin film radio frequency (RF) element wrapped around and supported by the body, an RF connector electrically coupled to the thin film RF element, and an outer layer molded between shutoff surfaces of the core mandrel and over the thin film RF element. The lip can extend over a top of a portion of the thin film RF element to secure the portion of the thin film radio frequency element between the body and the lip.

15 Claims, 6 Drawing Sheets

OVER-MOLDED THIN FILM ANTENNA DEVICE

FIELD

The present invention relates generally to radio frequency (RF) communications hardware. More particularly, the present invention relates to an over-molded thin film antenna device.

BACKGROUND

Thin film RF elements are commonly used in antenna designs and offer versatility, cost effectiveness, heat resistance, flexibility, and conformability. However, the flexibility and the conformability of the thin film RF elements can limit their use in rugged end use applications that require protection from dynamic shock and vibration and/or that require compact designs with limited space for fasteners. Typical solutions to these problems include encapsulating the thin film RF elements using long cure multipart potting compounds, expandable foams, or conventional molding processes. However, conventional molding processes tend to have a low yield due to increased resin processing pressures and heat exposure of the thin film RF elements and inner electrical elements. Furthermore, expandable foams can absorb moisture and tend to have high dielectric loading of the thin film RF elements, thereby degrading product performance.

In view of the above, there is a continuing, ongoing need for improved antenna systems.

DETAILED DESCRIPTION

Figure 1:
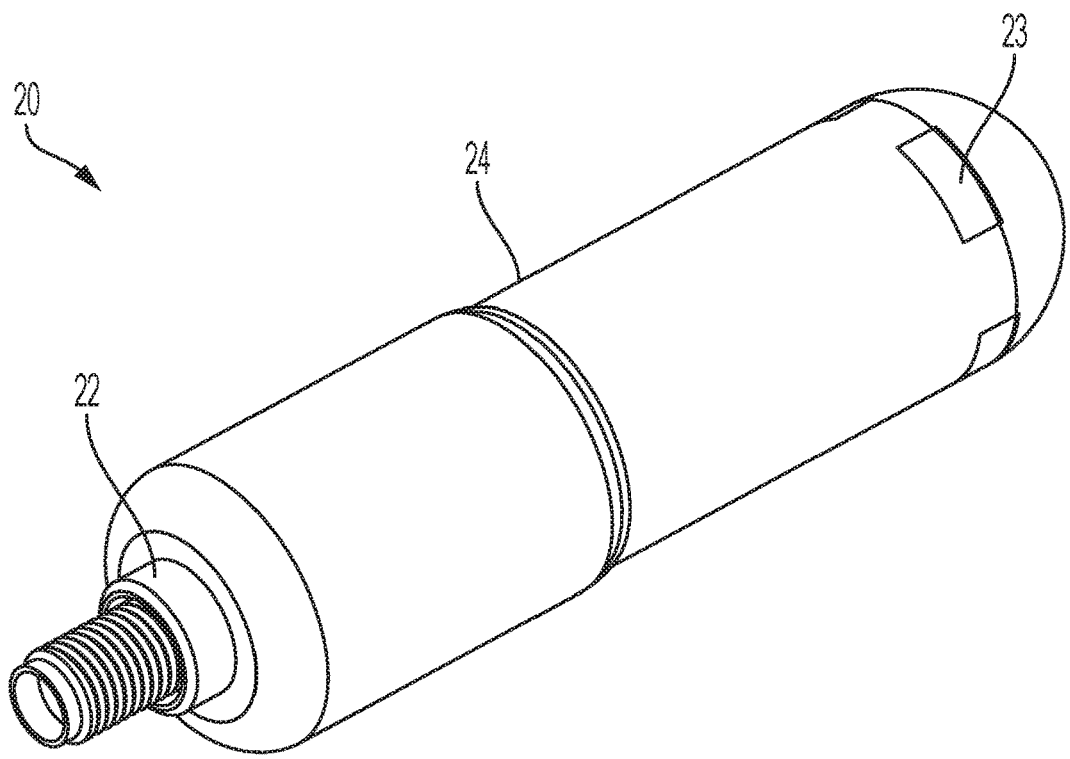
FIG. 1 is a perspective view of an over-molded thin film antenna device according to disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include a ruggedized over-molded thin film antenna device for RF applications that can include a thin film RF element in a helical or quadrifilar formation formed into a cylindrical shape over a hollow or solid support structure. For example, the hollow or solid support structure can include a cylindrical core mandrel around which the thin film RF element can be wrapped such that the cylindrical core mandrel can support a substrate of the thin film RF element. Embodiments disclosed herein can also include an antenna module that includes a core support that can hold the cylindrical core mandrel and the thin film RF element and that can precisely control a material flow of an over-molding hybrid polymer adhesive resin during a molding process to encompass the cylindrical core mandrel and the thin film RF antenna element with the over-molding hybrid polymer adhesive resin, thereby ruggedizing the thin film RF element.

In some embodiments, the substrate of the thin film RF element can vary in physical, mechanical, and electrical properties to suit a variety of antenna applications and operational frequencies. Furthermore, in some embodiments, the thin film RF element can include a metalized region on a first side thereof and a grounding band laminated to a second side thereof, opposite the first side. When wrapped onto the cylindrical core mandrel, in some embodiments, a resulting geometry of the thin film RF element can be held in place on the cylindrical core mandrel with a band of high bond temperature resistant tape (HBTRT), such as Kapton, and ground trace soldering. Further still, in some embodiments, the thin film RF element on the cylindrical core mandrel can be installed onto a base that interfaces with an RF connector and can be grounded to the base by soldering or conducting tape wrap.

The ruggedized over-molded thin film antenna device described herein can be constructed for use as either a passive device or an active device. As the passive device, the thin film RF element can be fed and routed to the RF connector via a coaxial cable or other suitable method, such as a microstrip line. However, as the active device, the thin film RF element can be soldered to a base PCB carrier or the base itself and fed by the microstrip line to a low noise amplifier (LNA) circuit that can be housed within an available volume of the cylindrical core mandrel. In any embodiment, a connector end of the ruggedized over-molded thin film antenna device can be adjusted to accommodate a wide range of possible connections and customization options for a multitude of mounting and RF interfaces.

In some embodiments, a head or other top geometric features of the cylindrical core mandrel can overlap the thin film RF element to prevent the over-molding hybrid polymer adhesive resin from infiltrating between an underside of the thin film RF element and the cylindrical core mandrel, for example, during the molding process. In some embodiments, the head or the other top geometric features can be part of a shutoff cap component that is separate from the cylindrical core mandrel, but can be solvent bonded to a body of the cylindrical core mandrel to establish the material flow of the over-molding hybrid polymer adhesive resin at a gate of a mold that facilitates the molding process.

In some embodiments, the cylindrical core mandrel can include shutoff surfaces that seal against a surface of the mold such that the cylindrical core mandrel can be held in a precise concentric relationship relative to the mold. A cavity of the mold can define a final geometry of the ruggedized over-molded thin film antenna device. Accordingly, the shutoff surfaces of the cylindrical core mandrel and the precise concentric relationship between the cylindrical core mandrel and the mold can ensure that the material flow of the over-molding hybrid polymer adhesive resin around the thin film RF element is uniform. For example, in some embodiments, the mold can be designed to receive the over-molding hybrid polymer adhesive resin (e.g. a Polymer-Adhesive) that is injected into the mold near a top center of the cylindrical core mandrel. In this manner, a combination of the mold, the mating surfaces of the cylindrical core mandrel, and the precise concentric relationship therebetween can result in an efficient, repeatable, and balanced low pressure over-molding (LPOM) cycle that can produce a robust and durable sealed device with predictable RF performance without any need for additional fasteners.

FIG. 1 is a perspective view of an over-molded thin film antenna device 20 according to disclosed embodiments. As seen in FIG. 1, the over-molded thin film antenna device 20 can include an antenna module 22 covered by an outer layer 24 that is molded between shutoff surfaces 23 of the antenna module 22. In some embodiments, the outer layer 24 can include a solidified polymer adhesive hybrid resin, and in some embodiments, the outer layer 24 can protect internal electrical components and RF structures of the over-molded thin film antenna device 20, for example, from moisture ingress, excessive molding pressures, and damaging heat exposure. Furthermore, in some embodiments, the outer layer 24 can provide a robust, durable housing without any need for mechanical fasteners.

Figure 2:
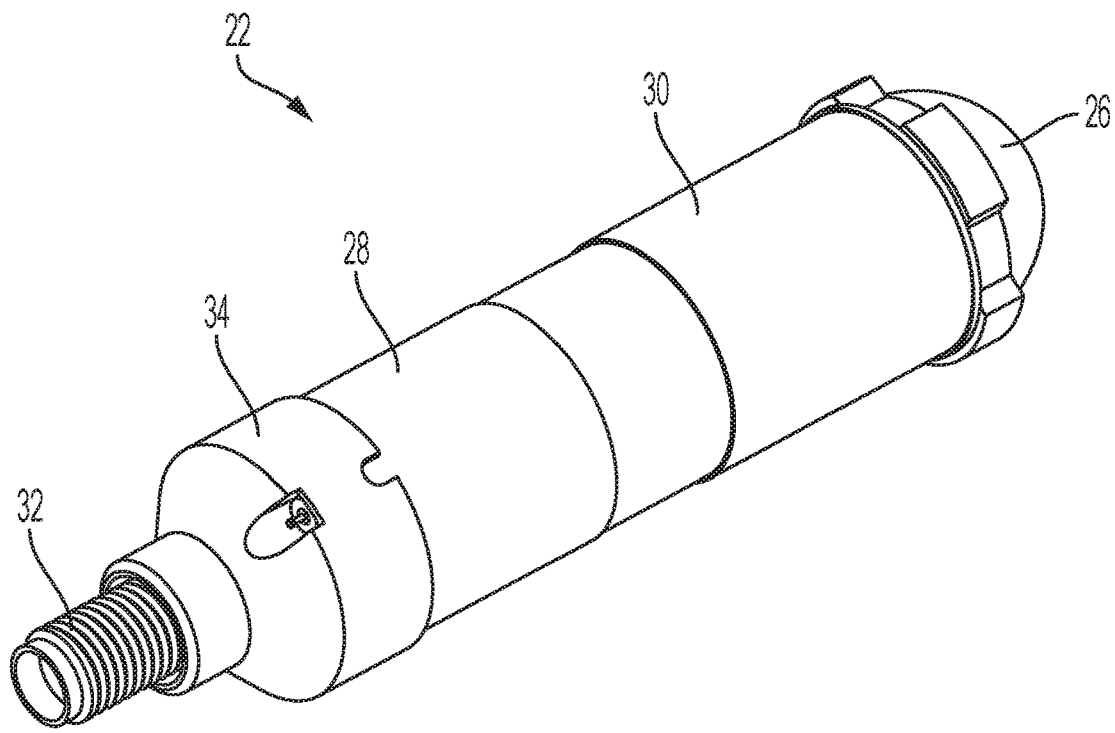
FIG. 2 is a perspective view of an antenna module of an over-molded thin film antenna device according to disclosed embodiments.

FIG. 2 is a perspective view of the antenna module 22 without the outer layer 24. As seen in FIG. 2, the antenna module 22 can include a core mandrel 26 and a thin film RF element 28 wrapped around and supported by the core mandrel 26. In some embodiments, a HBTRT layer 30 and ground trace soldering can secure the thin film RF element 28 to the core mandrel 26. Furthermore, as seen in FIG. 2, in some embodiments, the antenna module 22 can include an RF connector 32 electrically coupled to the thin film RF element 28, and in some embodiments, a base cap 34 can surround the RF connector 34 and an end of the core mandrel 26.

Figure 3:
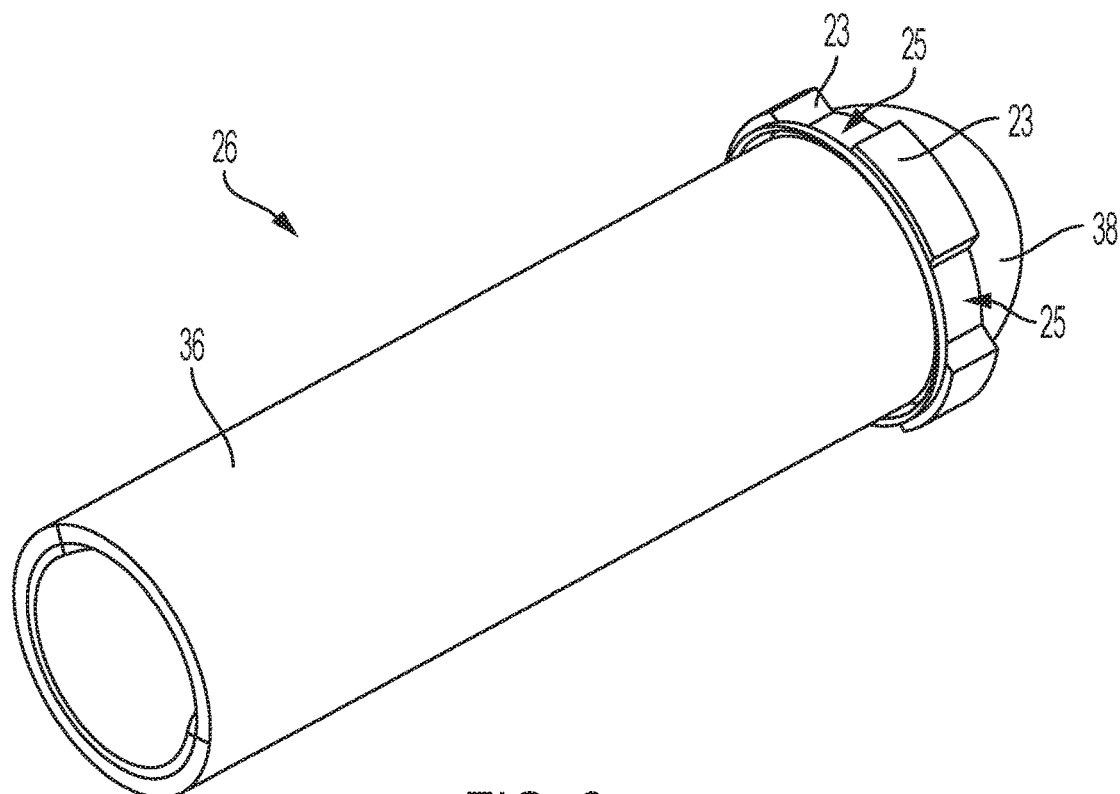
FIG. 3 is a perspective view of a core mandrel of an over-molded thin film antenna device according to disclosed embodiments.
Figure 4:
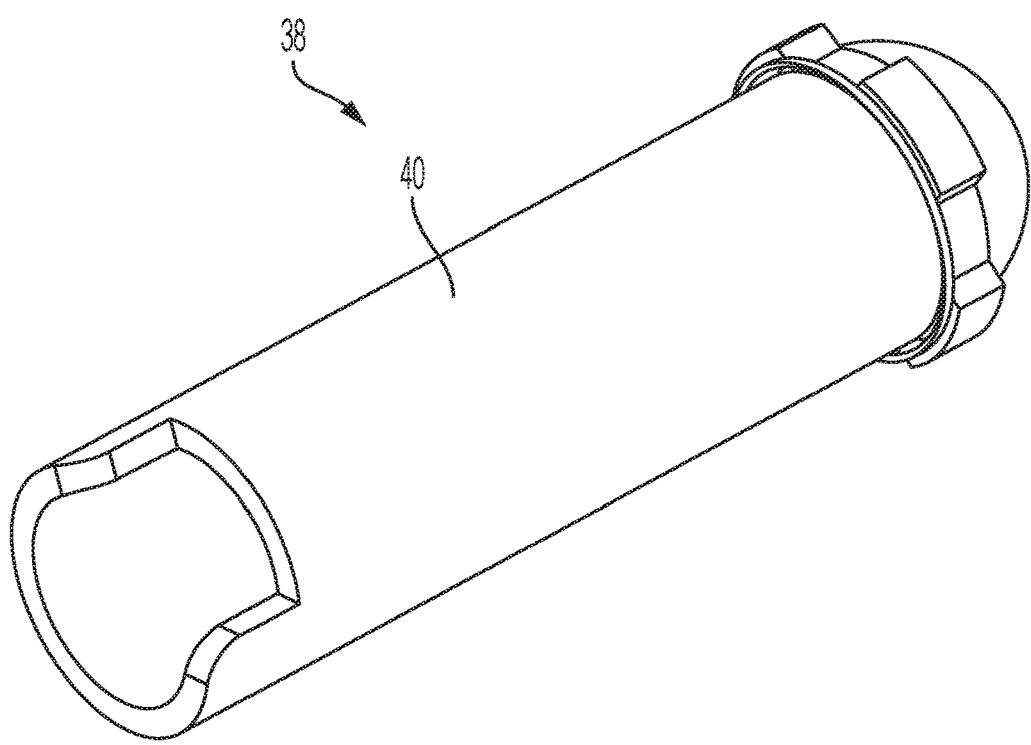
FIG. 4 is a perspective view of a portion of a core mandrel of an over-molded thin film antenna device according to disclosed embodiments.
Figure 5:
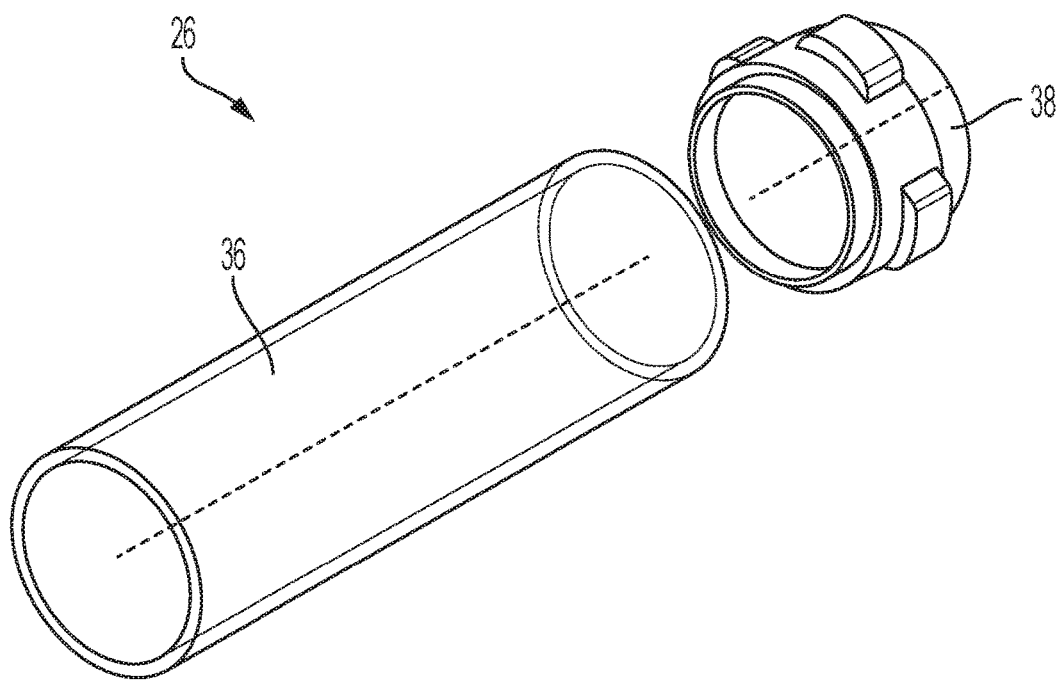
FIG. 5 is a perspective view of a core mandrel of an over-molded thin film antenna device according to disclosed embodiments.

FIG. 3 is a perspective view of the core mandrel 26. As seen in FIG. 3, the core mandrel 26 can include a body 36 and a cap 38. In some embodiments, the cap 38 can include the shutoff surfaces 23, and in some embodiments, the shutoff surfaces 23 can form channels 25. In some embodiments, the body 36 can be hollow, and in some embodiments, the body 36 can be solid. Furthermore, in some embodiments, the body 36 and the cap 38 can be integrally formed together as a solid monolithic part, and in some embodiments, the cap 38 can be solvent bonded to the body 36. For example, as seen in FIG. 4, in some embodiments, the cap 38 can include a tubular member 40 with a same approximate length as the body 36 that is secured inside of the body 36. However, as seen in FIG. 5, in some embodiments, the cap 38 can be secured to an end of the body 36 without the tubular member 40.

Various materials are contemplated for the core mandrel 26. For example, in some embodiments, materials with a high dielectric constant, such as Acrylonitrile Butadiene Styrene, nylon, and ceramic, can be used. Additionally or alternatively, in some embodiments, materials with a lower dielectric constant, such as Polycarbonate, Fluorinated ethylene propylene, and polytetrafluoroethylene, can be used.

Figure 6:
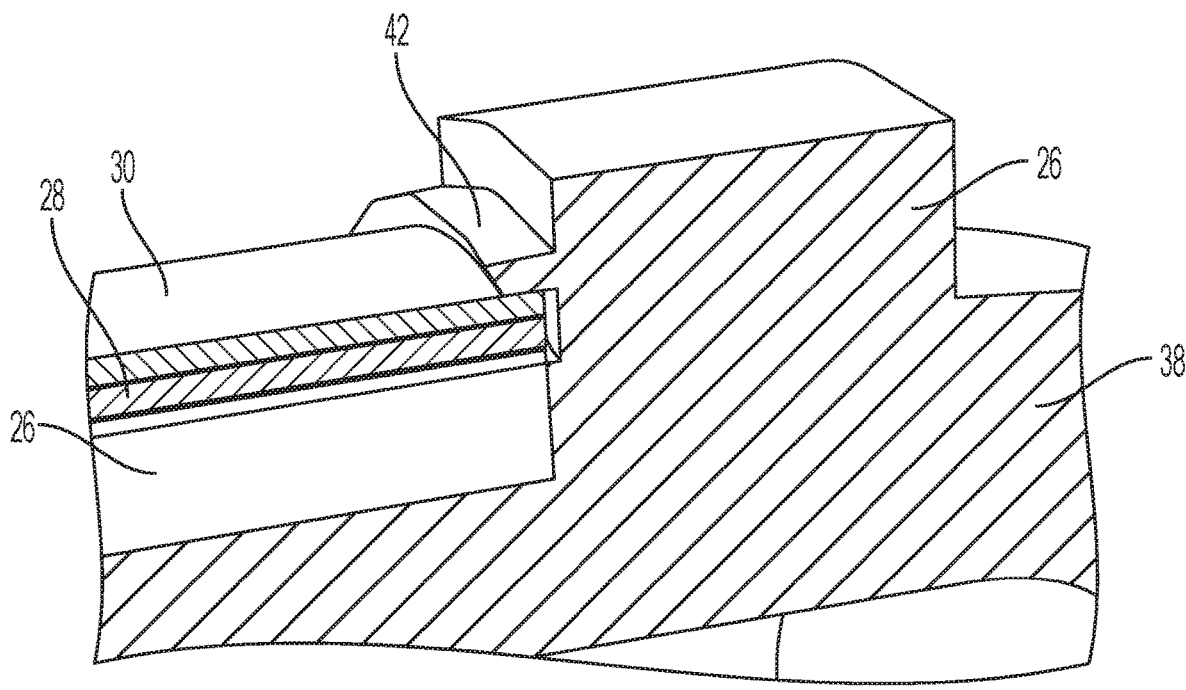
FIG. 6 is a cross-sectional view of a portion of an antenna module of an over-molded thin film antenna device according to disclosed embodiments.

FIG. 6 is a cross-sectional of a portion of the antenna module 22. As seen in FIG. 6, in some embodiments, the core mandrel 26 can include a lip 42 that can extend over a top of a portion of the thin film RF element 28 and the HBTRT layer 30 to secure the portion of the thin film element 28 and the HBTRT layer 30 between the body and the lip 42. When the outer layer 24 is over molded onto the antenna module 22, the lip 42 can prevent the polymer adhesive hybrid resin that is used to form the outer layer 24 from flowing onto an underside of the thin film RF element 28.

Figure 7:
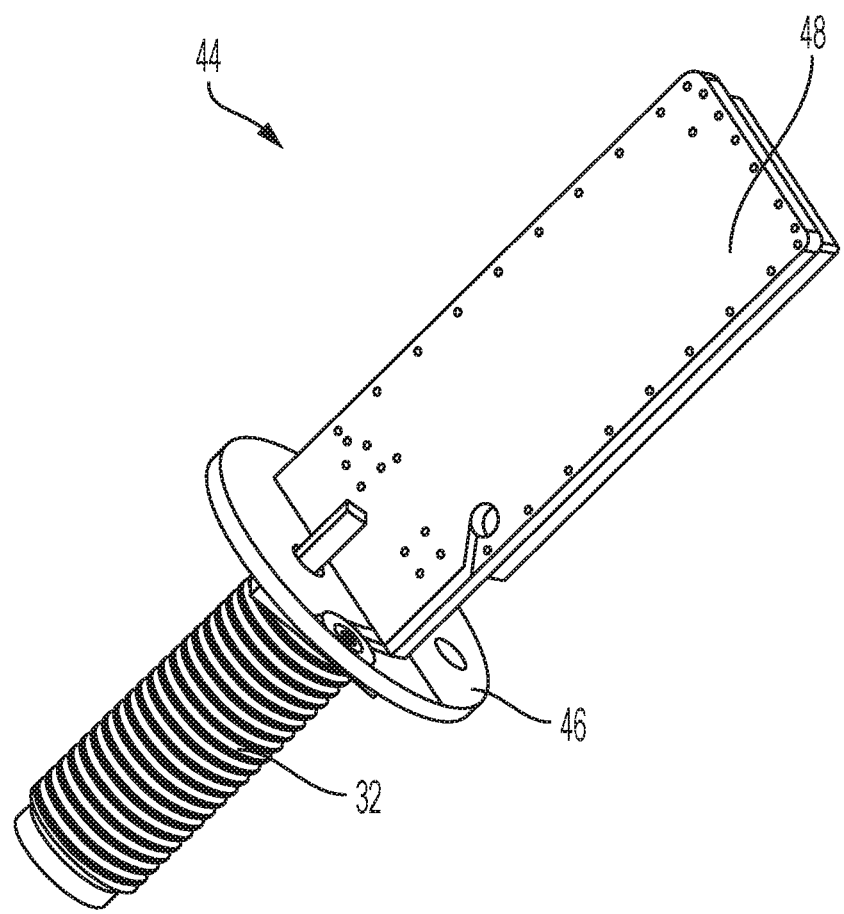
FIG. 7 is a perspective view of an active RF element of an antenna module of an over-molded thin film antenna device according to disclosed embodiments.
Figure 8:
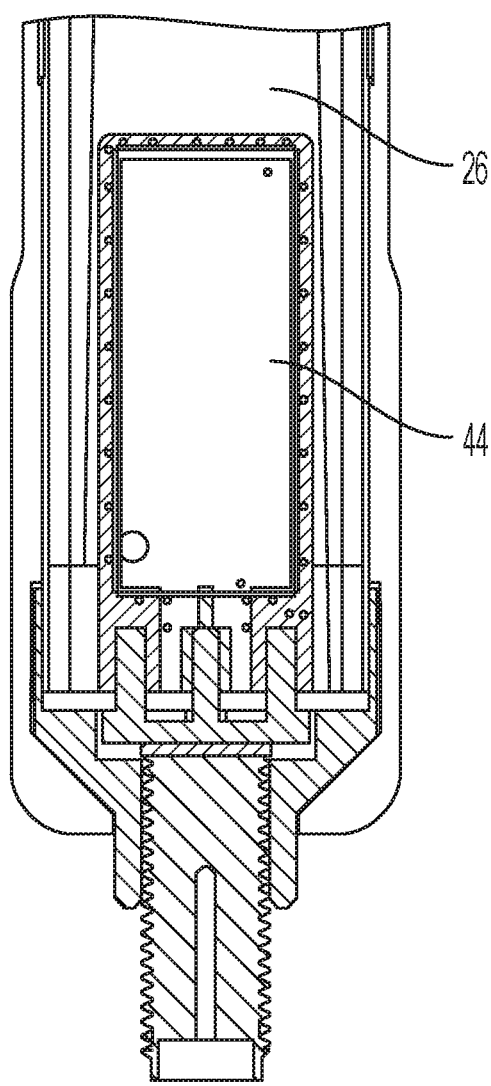
FIG. 8 is a cross-sectional view of a portion of an over-molded thin film antenna device according to disclosed embodiments.

In some embodiments, the over-molded thin film antenna device 20 can include an active component. For example, FIG. 7 is a perspective view of an active RF element 44 of the over-molded thin film antenna device 20 according to disclosed embodiments. As seen in FIG. 7, in some embodiments, the active RF element 44 can include a printed circuit board 46 electrically coupled to the RF connector 32 and a LNA circuit 48 electrically coupled to the printed circuit board 46. As seen in FIG. 8, in some embodiments, the active RF element 44 can be housed inside of the core mandrel 26, and in these embodiments, the thin film RF element 28 can be electrically coupled to the RF connector 32 via the printed circuit board 46 and the LNA circuit 48.

However, in some embodiments, the over-molded thin film antenna device 20 can include a passive component. For example, in these embodiments, a microstrip line can couple the thin film RF element 32 directly to the RF connector 32.

Figure 9:
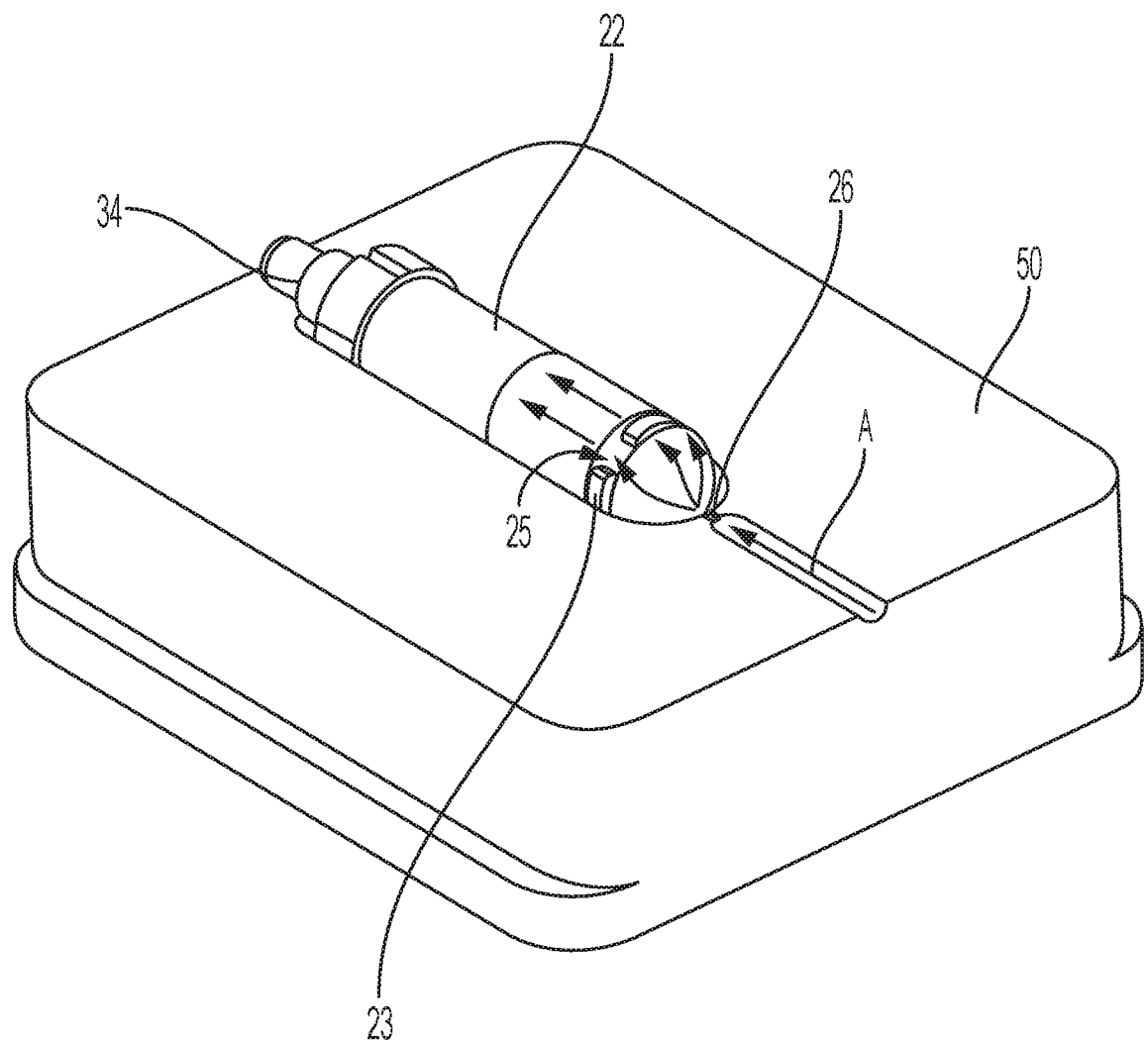
FIG. 9 is a perspective view of an antenna module of an over-molded thin film antenna device in a mold according to disclosed embodiments.

FIG. 9 is a perspective view of the antenna module 22 in a one half of a mold 50 according to disclosed embodiments. As seen in FIG. 9, when the antenna module 22 is placed in the mold 50, the shutoff surfaces 23 can seal against a surface of the mold 50 to hold the antenna module 22 in a concentric relationship with a cavity of the mold.

In operation, the polymer adhesive hybrid resin can be injected into the mold 50 such that the polymer adhesive hybrid resin can flow in a direction indicated by arrows A over the thin film RF element 28 while simultaneously refraining from flowing onto the underside of the thin film RF element 28. When solidified, the polymer adhesive hybrid resin can transform the antenna module 22 and the thin film RF element 28 into the over-molded thin film antenna device 20 as shown in FIG. 1.

In some embodiments, the polymer adhesive hybrid resin can be injected into the mold 50 at a top center of the core mandrel 26. Furthermore, in some embodiments, the shutoff surfaces 23 can direct a flow of the polymer adhesive hybrid resin over the thin film RF element 28. Similarly, in some embodiments, the base cap 34 can act as one of the shutoff surfaces 23 with respect to the mold 50 to prevent the polymer adhesive hybrid resin from flowing outside of the mold 50 while the polymer adhesive hybrid resin solidifies.

Further still, in some embodiments, the lip 42 can prevent the polymer adhesive hybrid resin from flowing onto the underside of the thin film RF element 28 during such a molding process. For example, in some embodiments, the lip 42 can position and constrain the thin film RF element 28 securely against itself in response to increasing pressure and temperature in the mold 50, which can control the flow of the polymer adhesive hybrid resin around the shutoff surfaces 23 and through the channels 25, thereby uniformly establish an over molded geometry of the over-molded thin film antenna device 20.

Although a few embodiments have been described in detail above, other modifications are possible. For example, other components may be added to or removed from the described systems, and other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. An antenna device comprising:
a core mandrel having a body and a lip;
a thin film radio frequency (RF) element wrapped around and supported by the body, wherein the lip extends over a top of a portion of the thin film RF element to secure the portion of the thin film RF element between the body and the lip;
an RF connector electrically coupled to the thin film RF element; and
an outer layer molded between shutoff surfaces of the core mandrel and over the thin film RF element.

2. The antenna device of claim 1 further comprising:
a printed circuit board electrically coupled to the RF connector; and
a low noise amplifier circuit electrically coupled to the printed circuit board,
wherein the low noise amplifier circuit is housed inside of the core mandrel, and
wherein the thin film RF element is electrically coupled to the RF connector through the printed circuit board and the low noise amplifier circuit.

3. The antenna device of claim 1 further comprising:
a microstrip line coupling the thin film RF element directly to the RF connector.

4. The antenna device of claim 1 further comprising:
a high bond temperature resistant tape layer and ground trace soldering securing the thin film RF element to the body.

5. The antenna device of claim 1 further comprising:
a cap of the core mandrel solvent bonded to the body, wherein the cap includes the lip and at least some of the shutoff surfaces.

6. The antenna device of claim 1 wherein the body is hollow.

7. The antenna device of claim 1 wherein the body is solid.

8. The antenna device of claim 1 wherein the core mandrel is one of Acrylonitrile Butadiene Styrene, nylon, ceramic, Polycarbonate, Fluorinated ethylene propylene, or polytetrafluoroethylene.

9. The antenna device of claim 1 wherein the outer layer includes a solidified polymer adhesive hybrid resin.

10. The antenna device of claim 1 further comprising:
a base cap surrounding the RF connector and an end of the core mandrel,
wherein the outer layer is molded over the base cap.

11. A core mandrel comprising:
a body configured to support a thin film radio frequency (RF) element; and
a cap configured to establish a material flow of a resin at a gate of a mold when the body and the cap are located in a cavity of the mold,
wherein the cap includes a lip configured to extend over a top of a portion of the thin film RF element to secure the portion of the thin film RF element between the body and the cap and to prevent the resin from flowing onto an underside of the thin film RF element.

12. The core mandrel of claim 11 wherein the cap is solvent bonded to the body.

13. The core mandrel of claim 11 wherein the body is hollow.

14. The core mandrel of claim 11 wherein the body is solid.

15. The core mandrel of claim 11 wherein the body and the cap are one of Acrylonitrile Butadiene Styrene, nylon, ceramic, Polycarbonate, Fluorinated ethylene propylene, or polytetrafluoroethylene.

* * * * *